(12) United States Patent
Lee et al.

(10) Patent No.: US 7,920,418 B2
(45) Date of Patent: Apr. 5, 2011

(54) NONVOLATILE MEMORY DEVICES AND METHODS OF FORMING THE SAME

(75) Inventors: Seung-Chul Lee, Gyenggi-do (KR); Keun-Ho Lee, Gyenggi-do (KR); Choong-Ho Lee, Gyenggi-do (KR); Byung-Yong Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 485 days.

(21) Appl. No.: 11/972,243

(22) Filed: Jan. 10, 2008

(65) Prior Publication Data

US 2008/0164509 A1 Jul. 10, 2008

(30) Foreign Application Priority Data

Jan. 10, 2007 (KR) ........................ 10-2007-0002974

(51) Int. Cl.
*G11C 11/34* (2006.01)

(52) U.S. Cl. .............. 365/185.01; 365/185.02; 365/104; 365/185.17; 257/315; 257/E29.3; 257/E21.209; 257/E21.662; 438/257

(58) Field of Classification Search ........................ None
See application file for complete search history.

(56) References Cited

U.S. PATENT DOCUMENTS

| 4,962,481 | A | * | 10/1990 | Choi et al. | ............... 365/185.17 |
| 5,468,981 | A | | 11/1995 | Hsu | |
| 7,170,788 | B1 | * | 1/2007 | Wan et al. | ................ 365/185.18 |
| 2001/0027006 | A1 | * | 10/2001 | Kim | ............................. 438/592 |

FOREIGN PATENT DOCUMENTS

| JP | 08-078541 | 3/1996 |
| JP | 2001-267435 | 9/2001 |
| KR | 10-1996-0012532 | 4/1996 |
| KR | 1019970024313 A | 5/1997 |
| KR | 10-0233294 | 9/1999 |

\* cited by examiner

*Primary Examiner* — Minh-Loan T Tran
*Assistant Examiner* — Fei Fei Yeung Lopez
(74) *Attorney, Agent, or Firm* — Myers Bigel Sibley & Sajovec, P.A.

(57) ABSTRACT

A nonvolatile memory device includes a semiconductor substrate of a first conductivity type, a plurality of word lines on the semiconductor substrate, each the plurality of word lines including a floating gate of a second conductivity type. A ground select line and a string select line are disposed on respective sides of word lines. An impurity region of the second conductivity type underlies a first word line adjacent the ground select line. The device may further include a second impurity region of the second conductivity type underlying a second word line adjacent the string select line. In still further embodiments, the device may further include third impurity regions of the second conductivity type underlying respective third word lines between the first word line and the second word line. Methods of forming such devices are also provided.

11 Claims, 11 Drawing Sheets

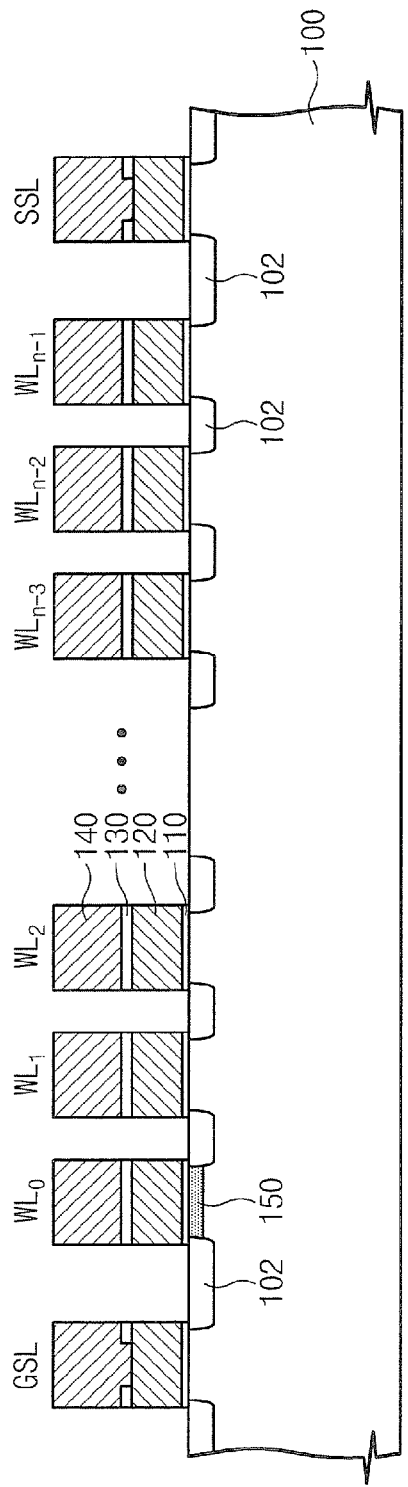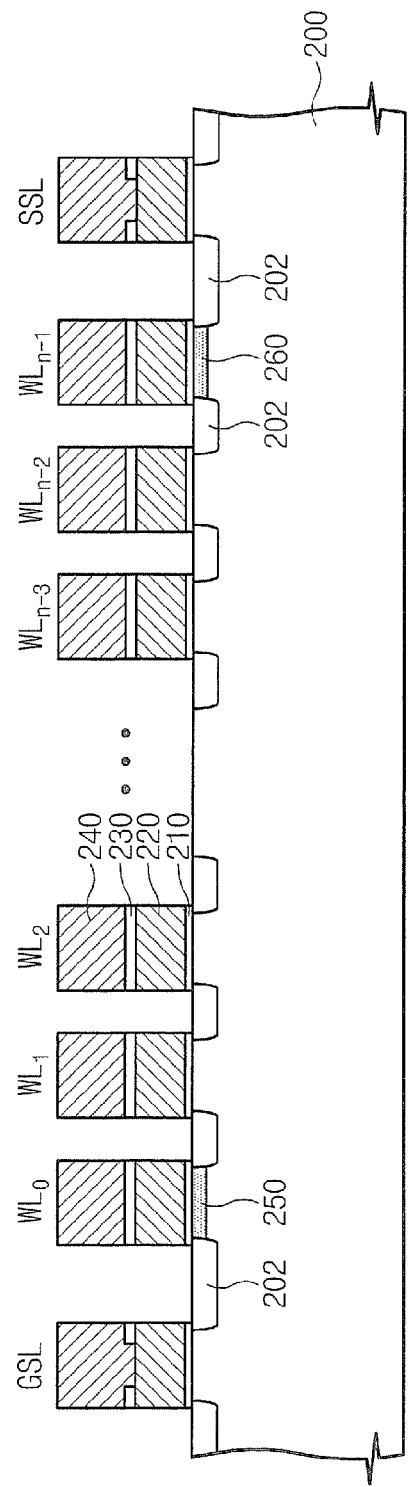

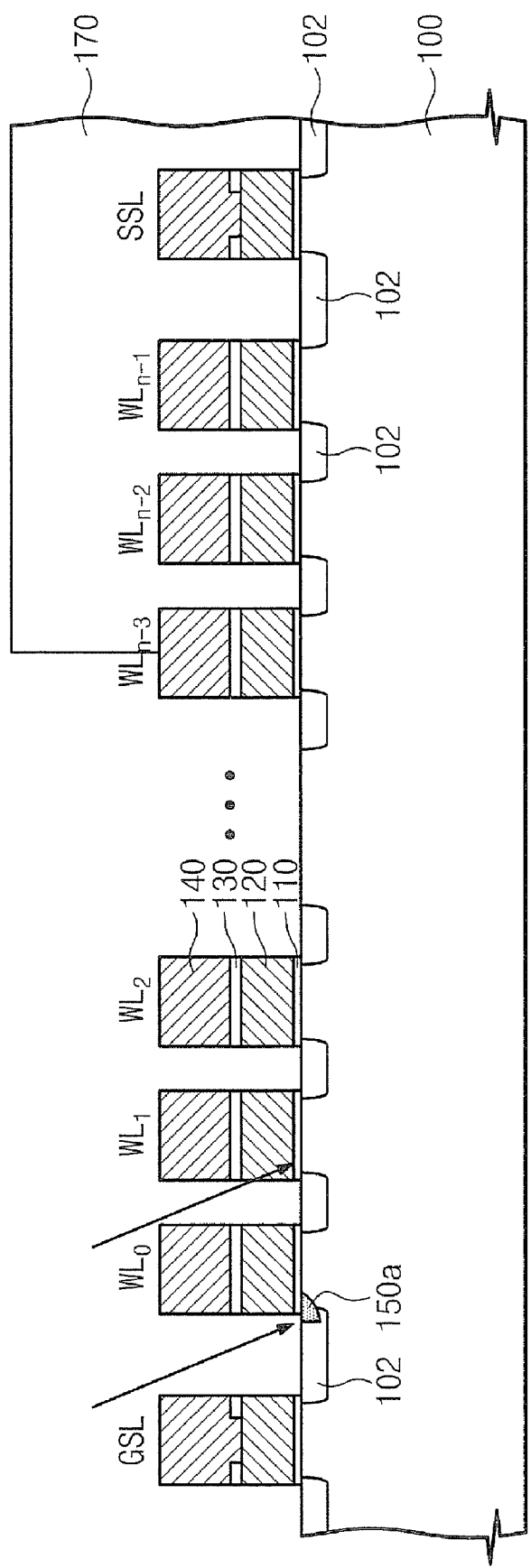

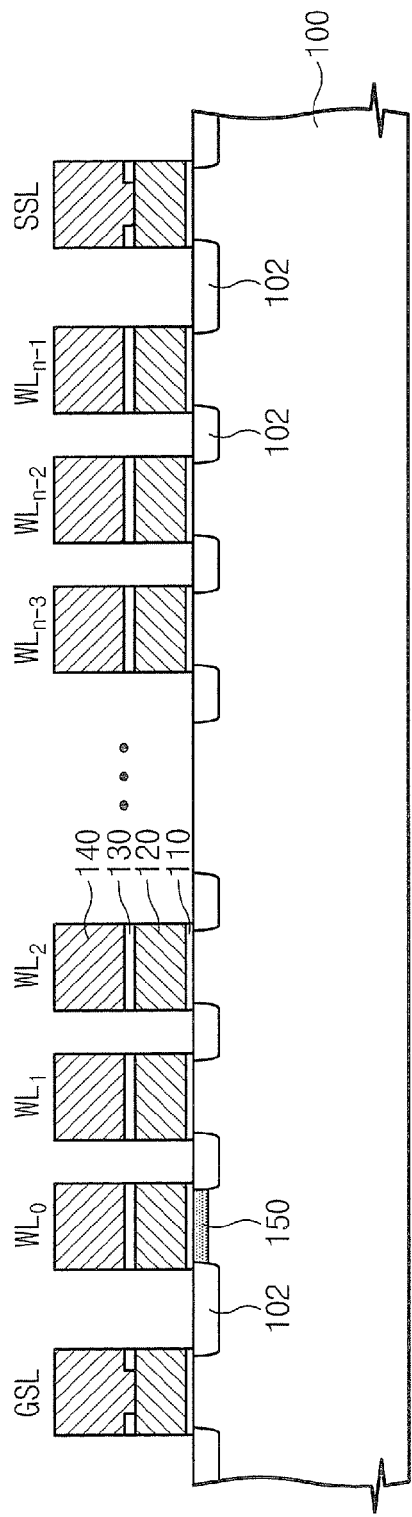
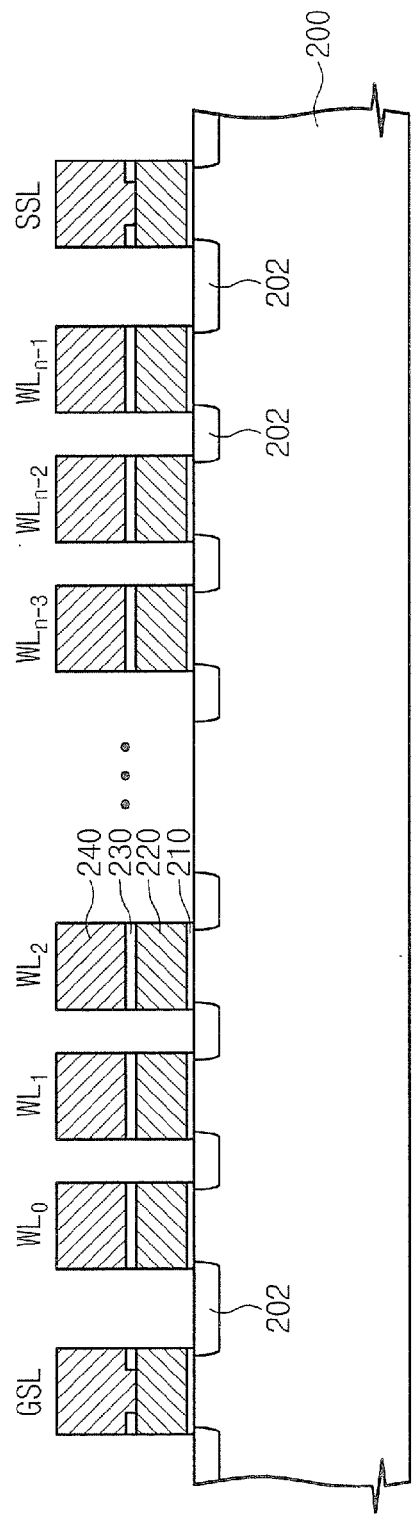

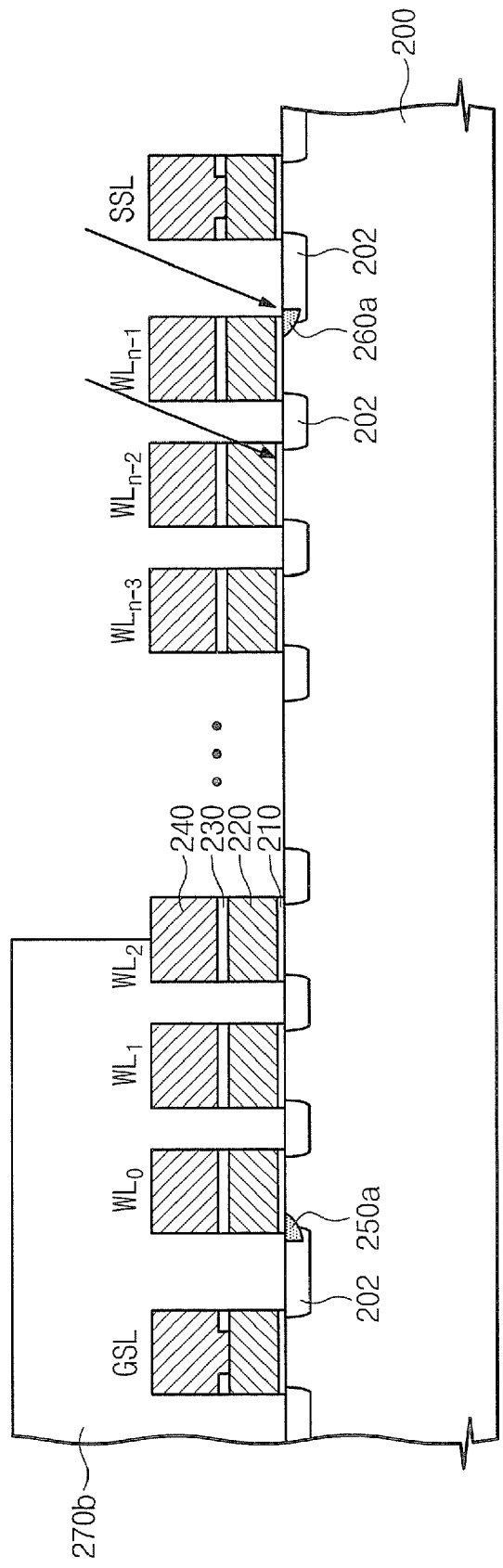

NONVOLATILE MEMORY DEVICES AND METHODS OF FORMING THE SAME

CROSS-REFERENCE TO RELATED APPLICATIONS

This U.S. non-provisional patent application claims priority under 35 U.S.C. §119 of Korean Patent Application No. 2007-0002974, filed on Jan. 10, 2007, the entire contents of which are herein incorporated by reference in their entirety.

BACKGROUND OF THE INVENTION

The present invention relates to semiconductor devices and methods of forming the same, and more particularly, to non-volatile semiconductor devices and methods of forming the same.

Semiconductor memory devices may be classified into volatile semiconductor memory devices and non-volatile semiconductor memory devices. A volatile semiconductor memory device typically loses stored data when its power supply is interrupted, while a non-volatile semiconductor memory device typically retains stored data even when its power supply is interrupted.

A flash memory is typically a highly integrated non-volatile device having advantages of an erasable programmable read-only memory (EPROM) and advantages of an electrically erasable programmable read-only memory (EEPROM). Types of flash memory devices include NOR-type flash memory devices and NAND-type flash memory devices. A NAND-type flash memory device may be advantageous with respect to high integration as it typically includes a basic unit including a string of memory cells that have common controls.

FIGS. 1 and 2 are a circuit diagram and a cross-sectional view, respectively, of a conventional non-volatile memory device. Referring to FIGS. 1 and 2, a NAND flash memory cell array includes a string select line SSL and a ground select line GSL. Word lines $WL_0$-$WL_{n-1}$ are arranged between the string select line SSL and the ground select line GSL. The string select line SSL, the ground select line GSL, and the word lines $WL_0$-$WL_{n-1}$ may include a tunnel insulating layer 20, a floating gate 30, an intergate dielectric 40, and a control gate 50. The condition of a program voltage of a selected memory cell $MC_{1i}$ in the NAND flash memory device is shown. A ground voltage GND is applied to a selected bit line $BL_i$ and a power supply voltage Vcc is applied to an unselected bit line $BL_{i+1}$. The power supply voltage Vcc is applied to the string select line SSL, and the ground voltage GND is applied to the ground select line GSL. A ground voltage GND is applied to a common source line CSL. A program voltage Vpgm is applied to a selected word line $WL_0$, and a pass voltage Vpass is applied to unselected word lines $WL_1$-$WL_{n-1}$. The ground voltage may be applied to a substrate.

While these operations are occurring, it is desirable that a memory cell $MC_{1i+1}$ of the selected word line WL0 and the unselected bit line $BL_{i+1}$ be prevented from being programmed. Thus, a channel voltage of the memory cell $MC_{1i+1}$ of the selected word line $WL_0$ and the unselected bit line $BL_{i+1}$ may be boosted to a high level to prevent programming of cells connected thereto.

Due to an electric potential difference between a channel region of the ground select line GSL and a channel region boosted to the high level, a strong electric field may be formed in a source/drain region 15 between the ground select line GSL and the word line $WL_0$, which may generate an electron-hole pair. A hole of the electron-hole pair may migrate to the substrate due to a substrate bias (arrow 3), and an electron of the pair may become a hot electron due to a strong horizontal electric field generated by a channel voltage of the ground select line GSL and a channel voltage of the selected word line $WL_0$ (arrow 1). The hot electron may be dispersed toward the selected word line $WL_0$ to be injected into the floating gate 30 (arrow 2). This phenomenon may occur between the string select line SSL and the adjacent word line $WL_{n-1}$. As a result, program disturbance may occur, i.e., a program inhibit cell may be programmed.

Potential effects of program disturbance will now be described with reference to graphs of FIGS. 3A and 3B, in which a vertical axis represents a threshold voltage Vth and a horizontal axis represents a pass voltage Vpass. FIG. 3A is a graph illustrating word lines $WL_0$, $WL_{n-1}$ where the program disturbance occurs, and FIG. 3B is a graph illustrating word lines $WL_1$-$WL_{n-1}$ where the program disturbance does not occur. FIG. 3A shows that, as number of program (NOP) increases, a threshold voltage may rise due to the program disturbance. The rise of the threshold voltage may become significant when a pass voltage Vpass is high. On the other hand, FIG. 3B shows that, even if a number of program (NOP) increases, threshold voltage may not substantially fluctuate.

SUMMARY OF THE INVENTION

According to some embodiments of the present invention, a nonvolatile memory device includes a semiconductor substrate of a first conductivity type and a plurality of word lines on the semiconductor substrate, each of the plurality of word lines including a floating gate of a second conductivity type. A ground select line and a string select line are disposed on the semiconductor substrate on respective sides of the word lines. An impurity region of the second conductivity type underlies a first word line adjacent the ground select line. The impurity region may be interposed between the first word line and an underlying channel region in the semiconductor substrate. The first conductivity type may be p-type and the second conductivity type may be n-type.

In further embodiments, the impurity region includes a first impurity region and the device further includes a second impurity region of the second conductivity type disposed underlying a second word line adjacent the string select line. In still further embodiments, the device may further include third impurity regions of the second conductivity type disposed underlying respective third word lines between the first word line and the second word line.

Additional embodiments of the present invention provide methods of forming a nonvolatile memory device including forming a plurality of word lines on a semiconductor substrate of a first conductivity type, each of the plurality of word lines including a floating gate of a second conductivity type. A ground select line and a string select line are formed on the substrate on respective sides of the word lines. An impurity region of the second conductivity type is formed underlying a first word line adjacent the ground select line. The impurity region may be interposed between the first word line and an underlying channel region in the semiconductor substrate. The first conductivity type may be p-type and the second conductivity type may be n-type.

In some embodiments, forming an impurity region includes performing an oblique ion implantation using the word lines as masks to form a preliminary impurity region adjacent the first word line and annealing the semiconductor substrate to form the impurity region from the preliminary impurity region. A distance between the word lines may be less than a distance between the first word line and the ground select line, and the oblique ion implantation process may be performed at an angle such that impurity ions are implanted into the semiconductor substrate between the first word line and the ground select line and are not implanted into the semiconductor substrate between the word lines. In some embodiments, performing an oblique ion implantation is preceded by forming a photoresist pattern covering the string select line and a second word line adjacent the string select line and performing an oblique ion implantation includes performing the oblique ion implantation using the photoresist pattern as an ion implantation mask.

In further embodiments, the impurity region includes a first impurity region and the methods further include forming a second impurity region of the second conductivity type at a channel region underlying a second word line adjacent the string select line. Forming a second impurity region may include performing an oblique ion implantation process using the word lines as masks to form a preliminary impurity region adjacent the second word line and annealing the semiconductor substrate to form the second impurity region from the preliminary impurity region. A distance between the word lines may be less than a distance between the second word line and the string select line and the oblique ion implantation process may be performed at an angle such that impurity ions are implanted into the semiconductor substrate between the second word line and the string select line and not implanted into the semiconductor substrate between the word lines. Performing an oblique ion implantation process may be preceded by forming a photoresist pattern covering the ground select line and the first word line, and performing an oblique ion implantation may include performing the oblique ion implantation using the photoresist pattern as an ion implantation mask.

Further embodiments of the present invention provide methods of forming a nonvolatile memory device including forming impurity regions of a second conductivity type in a semiconductor substrate of a first conductivity type and forming word lines, each including a floating gate of the second conductivity type, on respective ones of the impurity regions. A ground select line and a string select line are formed on the semiconductor substrate on respective sides of the word lines. Source/drain regions are formed in the semiconductor substrate between the word lines. The impurity regions may be interposed between the word lines and respective channel regions in the substrate. The first conductivity type may be p-type and the second conductivity type may be n-type. The methods may include forming an impurity region of the second conductivity type in the substrate and implanting ions into the substrate using the word lines as an ion implantation mask to form the impurity regions and the source/drain regions.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 4 is a cross-sectional view of a non-volatile memory device in accordance with some embodiments of the present invention.

FIG. 5 is a cross-sectional view of a non-volatile memory device in accordance with further embodiments of the present invention.

FIGS. 7A to 7C are cross-sectional views illustrating operations for forming a non-volatile memory device in accordance with some embodiments of the present invention.

FIGS. 8A to 8D are cross-sectional views illustrating operations for forming a non-volatile memory device in accordance with further embodiments of the present invention.

DETAILED DESCRIPTION OF EMBODIMENTS

Figure 1:
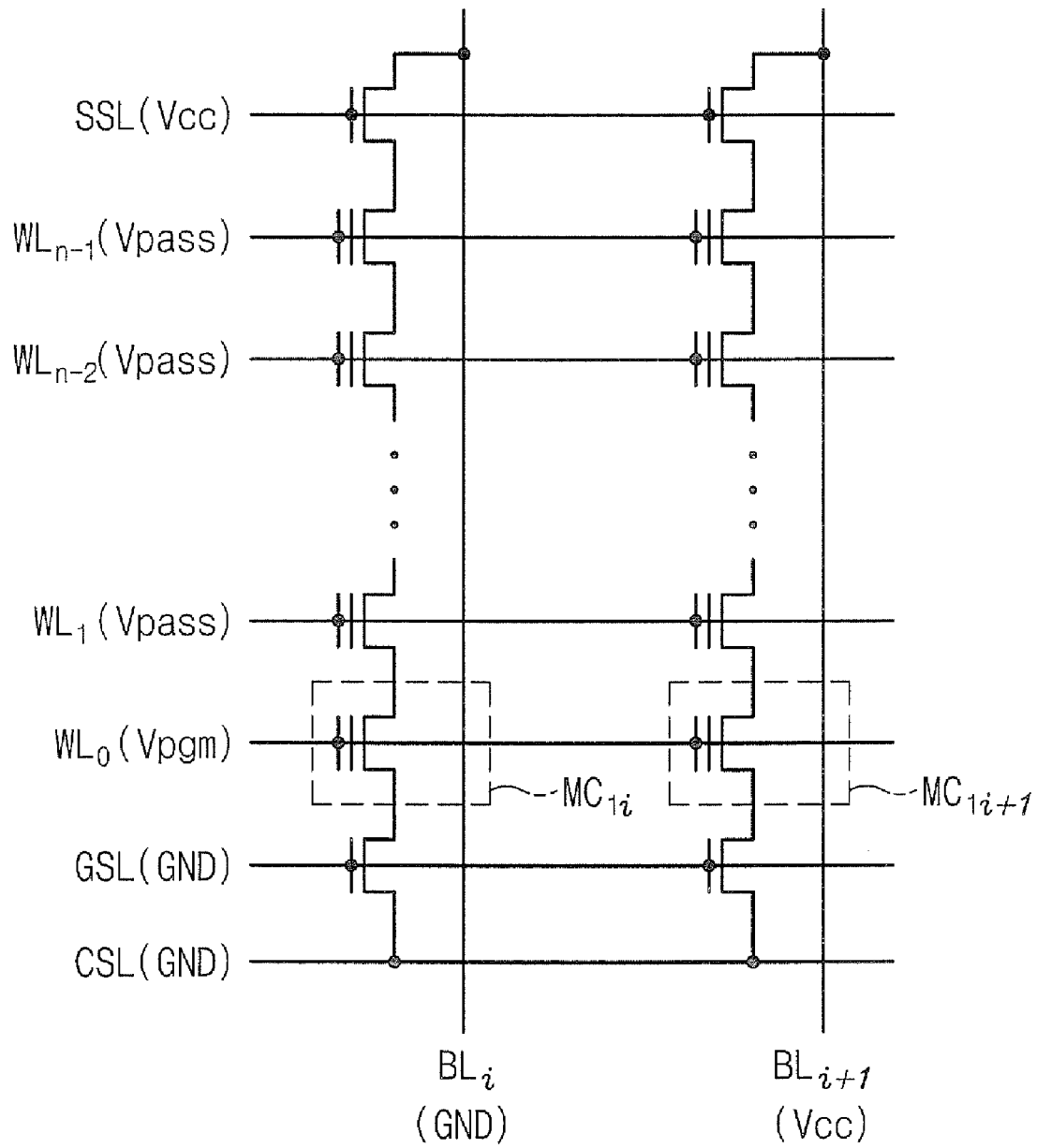
FIG. 1 is a schematic diagram of a conventional non-volatile memory device.
Figure 2:
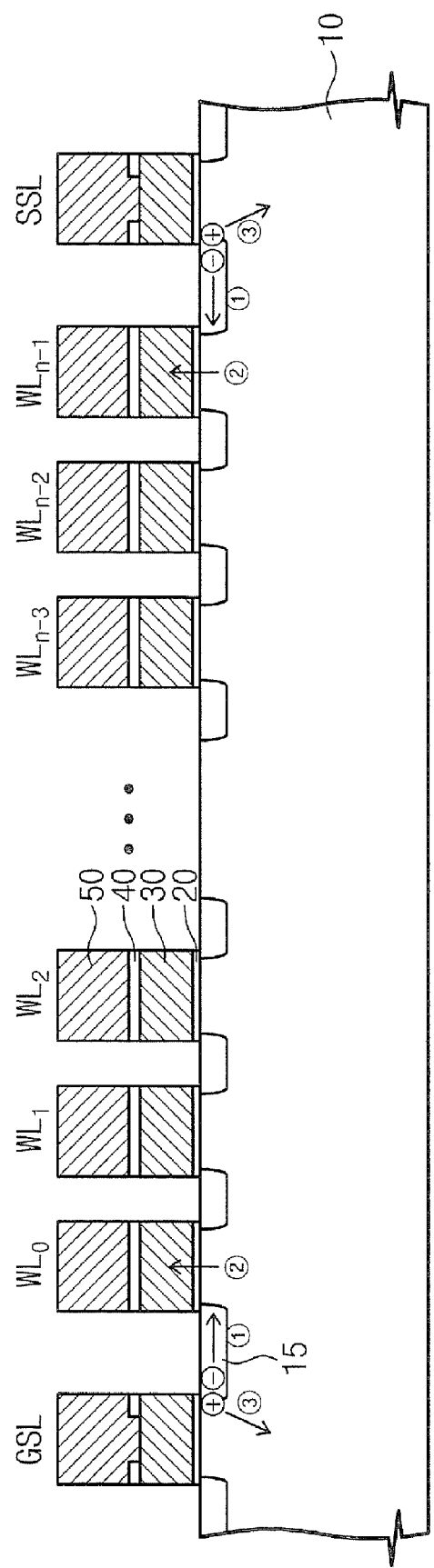
FIG. 2 is a cross-sectional view of a conventional non-volatile memory device.
Figure 3A:
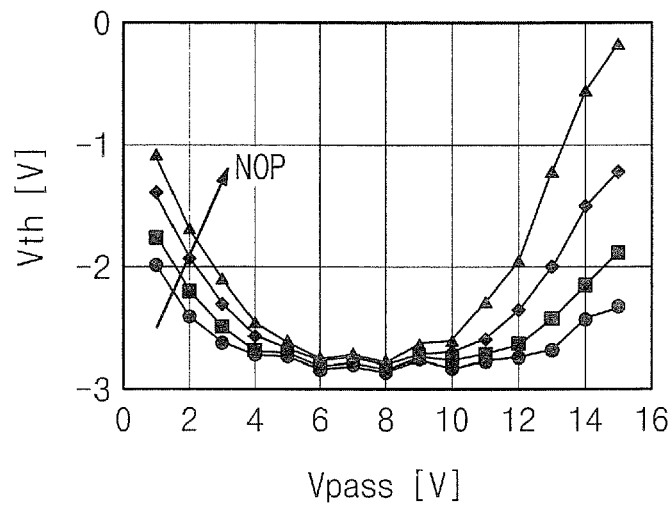
FIGS. 3A and 3B are graphs showing program disturbance in accordance with conventional non-volatile memory device.
Figure 3B:
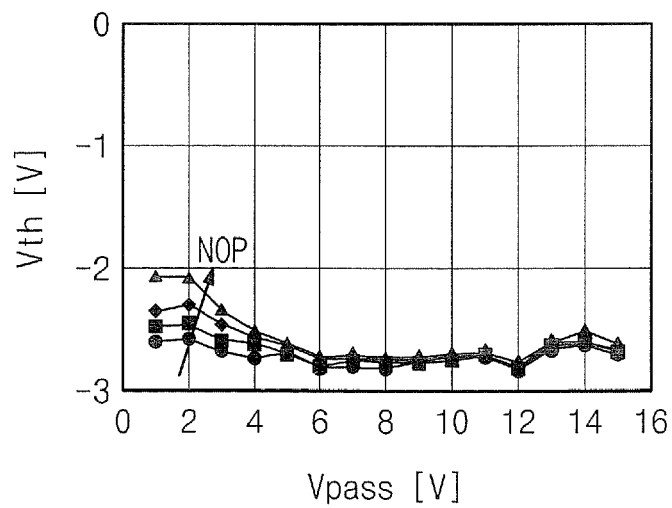

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Referring to FIG. 4, a semiconductor substrate 100 is provided. Word lines $WL_0$-$WL_{n-1}$ are disposed on the semiconductor substrate 100. The semiconductor substrate 100 may have a first conductivity type (e.g., p-type). Each of the word lines $WL_0$-$WL_{n-1}$ may include a tunnel insulating layer 110 on the semiconductor substrate 100, a floating gate 120 on the tunnel insulating layer 110, an intergate dielectric 130 on the floating gate 120, and a control gate 140 on the intergate dielectric 130. The floating gate 120 may have a second conductivity type, e.g., may include n-type polysilicon.

A ground select line GSL and a string select line SSL are disposed on respective sides of the word lines $WL_0$-$WL_{n-1}$. Source/drain regions 102 are provided in the semiconductor substrate 100 between the word lines $WL_0$-$WL_{n-1}$, between the ground select line GSL and a word line $WL_0$, and between the string select line SSL and a word line $WL_{n-1}$. A first impurity region 150 having the second conductivity type (e.g., n-type) underlies the word line $WL_0$ adjacent the ground select line GSL. The first impurity region 150 is interposed between the first word line $WL_0$ and a channel region in the substrate 100, i.e., the first impurity region may prevent a channel associated with the first word line $WL_0$ from being formed near the surface of the semiconductor substrate 100. Threshold voltages of the first word line $WL_0$ and the other word lines $WL_1$-$WL_{n-1}$ may be controlled within a predetermined range while being programmed and erased.

In a unit string of FIG. 4, the channel regions of the word lines $WL_0$-$WL_{n-1}$ may be boosted to prevent programming. A program voltage Vpgm is applied to the first word line $WL_0$ and a pass voltage Vpass is applied to the other word lines $WL_1$-$WL_{n-1}$. A ground voltage is applied to the ground select line GSL.

Electron-hole pairs may be generated at source/drain regions between the ground select line GSL and the word line $WL_0$. The electrons in the pairs may become hot electrons due to a horizontal electric field generated between the channel region of the first word line $WL_0$ and the channel region of the ground select line GSL. The channel region of the first word line $WL_0$ may be separated from an upper surface of the semiconductor substrate 100 by the first impurity region 150. Therefore, the first impurity region 150 may reduce injection of hot electrons into the floating gate 120.

Referring to FIG. 5, a semiconductor substrate 200 is provided. The semiconductor substrate 200 may have a first conductivity type (e.g., p-type). Word lines $WL_0$-$WL_{n-1}$ are disposed on the semiconductor substrate 200. Each of the word lines $WL_0$-$WL_{n-1}$ may include a tunnel insulating layer 210 on the semiconductor substrate 200, a floating gate 220 on the tunnel insulating layer 210, an intergate dielectric 230 on the floating gate 220, and a control gate 240 on the intergate dielectric 230. The floating gate 220 has a second conductivity type, e.g., may include n-type polysilicon.

A ground select line GSL and a string select line SSL are disposed on respective sides of the word lines $WL_0$-$WL_{n-1}$. Source/drain regions 202 are provided between the word lines $WL_0$-$WL_{n-1}$, between the ground select line GSL and a first word line $WL_0$, and between the string select line SSL and a second word line $WL_{n-1}$. A first impurity region of n-type 250 underlies the first word line $WL_0$ adjacent the ground select line GSL. A second impurity region of n-type 260 underlies the second word line $WL_{n-1}$ adjacent the string select line SSL.

In the unit string of FIG. 5, the channel regions of the word lines $WL_0$-$WL_{n-1}$ may be boosted to prevent programming. A program voltage Vpgm is applied to the first word line $WL_0$ and a pass voltage Vpass is applied to the other word lines $WL_1$-$WL_{n-1}$. A ground voltage is applied to the ground select line GSL.

Electron-hole pairs may be generated at source/drain regions between the ground select line GSL and the first word line $WL_0$, and between the string select line SSL and the second word line $WL_{n-1}$. The electrons in the pairs may become hot electrons due to a horizontal electric field generated between the channel regions of the first word line $WL_0$ and the ground select line GSL. In addition, the electrons may become hot electrons due to a horizontal electric field generated between the channel regions of the second word line $WL_{n-1}$ and the string select line SSL. The channel regions of the first word line $WL_0$ and the second word line $WL_{n-1}$ may be separated from an upper surface of the semiconductor substrate 100 by the first impurity region 250 and the second impurity region 260, respectively. Therefore, the first impurity region 150 and the second impurity region 260 may reduce hot electron injection into the floating gates 120.

Figure 6:
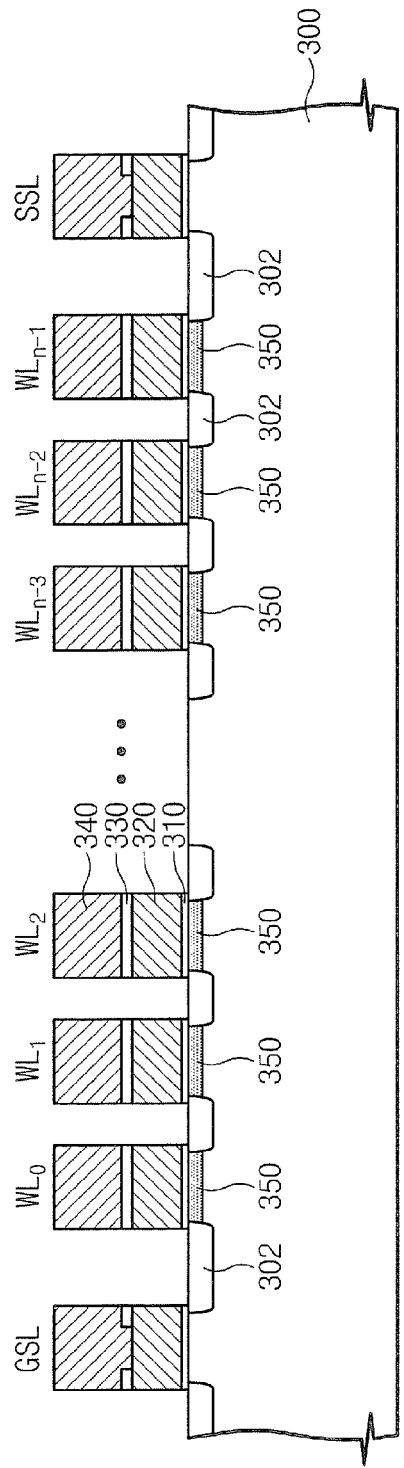
FIG. 6 is a cross-sectional view of a non-volatile memory device in accordance with still further embodiments of the present invention.

Referring to FIG. 6, a semiconductor substrate 300 is provided. The semiconductor substrate 300 may have a first conductivity (e.g., p-type). Word lines $WL_0$-$WL_{n-1}$ are disposed on the semiconductor substrate 300. Each of the word lines $WL_0$-$WL_{n-1}$ may include a tunnel insulating layer 310 on the semiconductor substrate 300, a floating gate 320 on the tunnel insulating layer 310, an intergate dielectric 330 on the floating gate 320, and a control gate 340 on the intergate dielectric 330. The floating gate 320 has a second conductivity type, e.g., may include n-type polysilicon.

A ground select line GSL and a string select line SSL are disposed on respective sides of the word lines $WL_0$-$WL_{n-1}$. Source/drain regions 302 are provided between the word lines $WL_0$-$WL_{n-1}$, between the ground select line GSL and a first word line $WL_0$, and between the string select line SSL and a second word line $WL_{n-1}$. Impurity regions 350 of the second conductivity type (e.g., n-type) 350 underlie the word lines $WL_0$-$WL_{n-1}$.

In the unit string of FIG. 6, the channel regions of the word lines $WL_0$-$WL_{n-1}$ may be boosted to prevent programming. A program voltage Vpgm is applied to the first word line $WL_0$ and a pass voltage Vpass is applied to the other word lines $WL_1$-$WL_{n-1}$. A ground voltage is applied to the ground select line GSL.

Electron-hole pairs may be generated at source/drain regions between the ground select line GSL and the first word line $WL_0$ and between the string select line SSL and the second word line $WL_{n-1}$. The electrons of the pairs may become hot electrons due to a horizontal electric field generated in the channel regions of the first word line $WL_0$ and the ground select line GSL and a horizontal electric field generated in the channel regions of the second word line $WL_{n-1}$ and the string select line SSL. Channels underlying the first word line $WL_0$ and the second word line $WL_{n-1}$ may be separated from an upper surface of the semiconductor substrate 300 by the impurity regions 350. The impurity regions 350 may reduce injection of hot electrons into the floating gates 320 to reduce program disturbance.

Figure 7A:
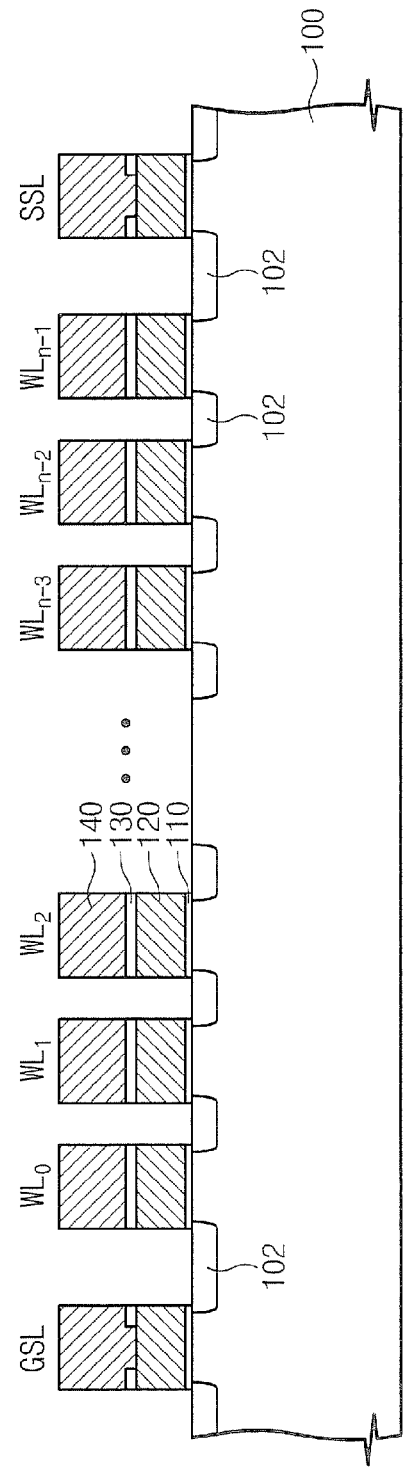

Referring to FIG. 7A, a p-type semiconductor substrate 100 is provided. Word lines $WL_0$-$WL_{n-1}$ are formed on the semiconductor substrate 100. A ground select line GSL and a string select line SSL are disposed on the substrate on respective sides of the word lines $WL_0$-$WL_{n-1}$. An ion implantation process is applied to the semiconductor substrate 100, which is exposed between the word lines $WL_0$-$WL_{n-1}$, the ground select line GSL, and the string select line SSL, to form source/drain regions 102.

Referring to FIG. 7B, a photoresist pattern 170 is formed on the semiconductor substrate 100. An oblique ion implantation process is performed using the word lines $WL_0$-$WL_{n-1}$ and the photoresist pattern 170 as masks to form a preliminary impurity region 150a at the semiconductor substrate 100 adjacent a first word line $WL_0$ disposed adjacent the ground select line GSL. The photoresist pattern 170 prevents ion implantation into the semiconductor substrate 100 between the string select line SSL and a second word line $WL_{n-1}$ adjacent the string select line SSL. Because a distance between the word lines $WL_0$-$WL_{n-1}$ is less than a distance between the ground select line GSL and the first word line $WL_0$, the first preliminary impurity region 150a may not be formed in the semiconductor substrate 100 between the word lines $WL_0$-$WL_{n-1}$. Referring to FIG. 7C, an annealing process is applied to the semiconductor substrate 100 to expand the preliminary impurity region 150a underneath the first word line $WL_0$. As a result, an impurity region 150 is formed, which may reduce vulnerability to program disturbance.

Referring to FIG. 8A, a p-type semiconductor substrate 200 is provided. A plurality of word lines $WL_0$-$WL_{n-1}$ is formed on the semiconductor substrate 200. A ground select line GSL and a string select line SSL are formed on the substrate 200 on respective sides of the word lines $WL_0$-$WL_{n-1}$. An ion implantation process is applied to the semiconductor substrate 200, which is exposed between the word lines $WL_0$-$WL_{n-1}$, the ground select line GSL and the string select line SSL, to form source/drain regions 202.

Figure 8B:
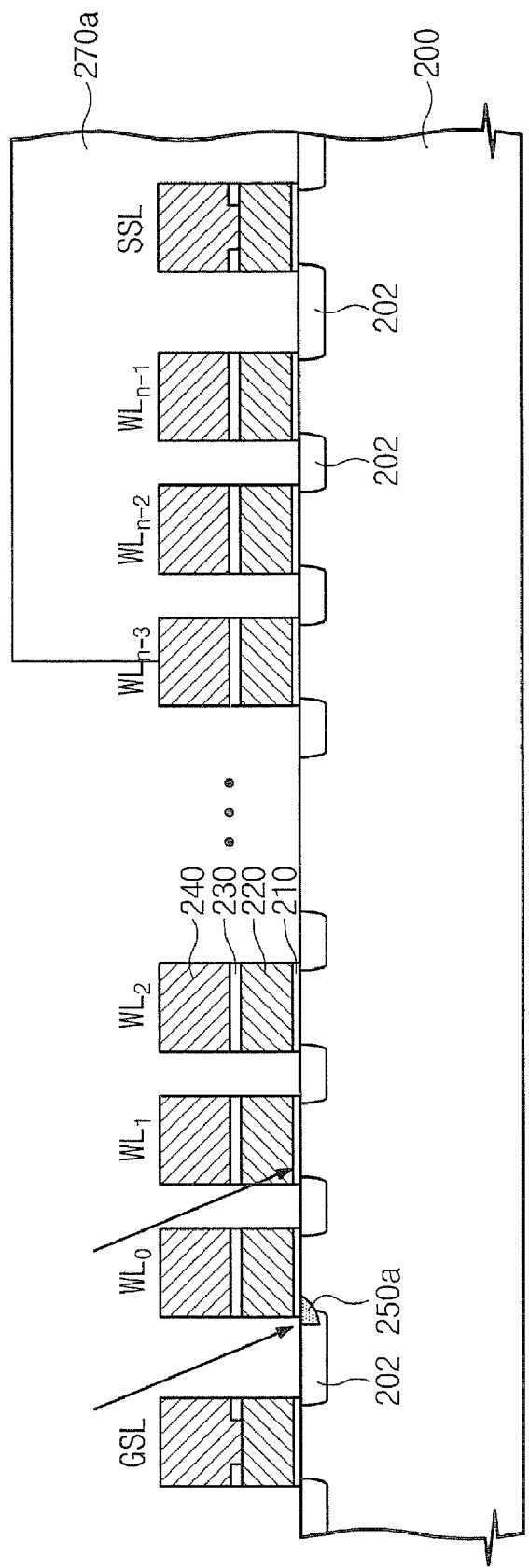

Referring to FIG. 8B, a first photoresist pattern 270a is formed on the semiconductor substrate 200. An oblique ion implantation process is performed using the word lines $WL_0$-$WL_{n-1}$ and the first photoresist pattern 270a as masks to form a first preliminary impurity region 250a on the semiconductor substrate 200 adjacent a first word line $WL_0$. The first photoresist pattern 270a may prevent ion implantation into the semiconductor substrate 200 between the string select line SSL and a second word line $WL_{n-1}$ adjacent the string select line SSL. Because a distance between the word lines $WL_0$-$WL_{n-1}$ is less than a distance between the ground select line GSL and the first word line $WL_0$, impurity regions may not be formed in the semiconductor substrate 200 between the word lines $WL_0$-$WL_{n-1}$.

Referring to FIG. 8C, a second photoresist pattern 270b is formed on the semiconductor substrate 200. An oblique ion implantation process is performed using the word lines $WL_0$-$WL_{n-1}$ and the second photoresist pattern 270b as masks to form a second preliminary impurity region 260a in the semiconductor substrate 200 adjacent a second word line WLn−1. The second photoresist pattern 270b may prevent ion implantation into the semiconductor substrate 200 between the ground select line GSL and a first word line $WL_0$.

Figure 8D:
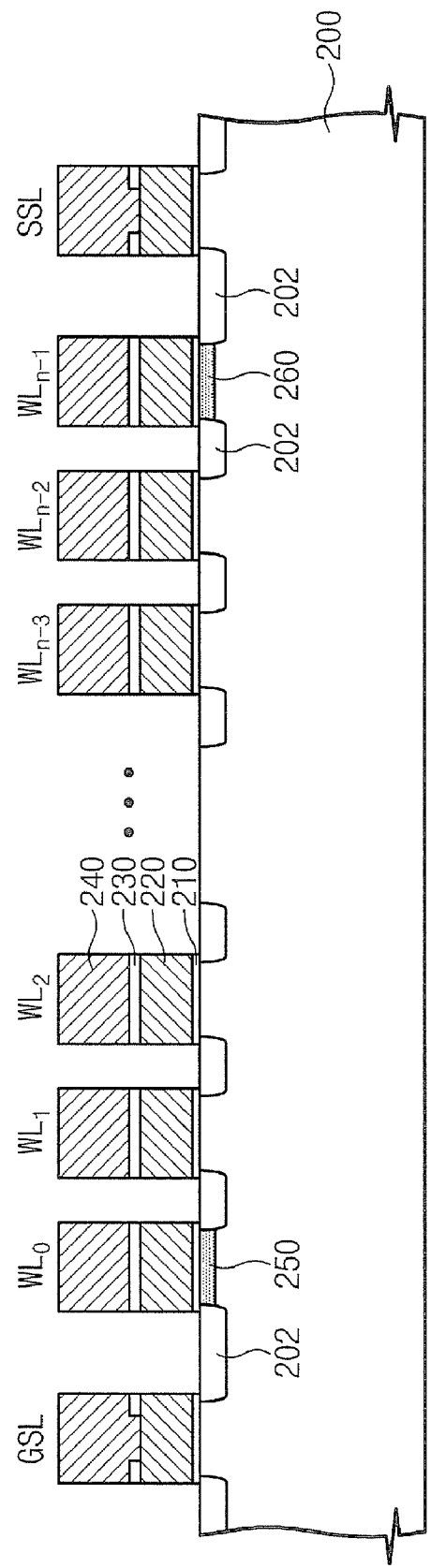

Referring to FIG. 8D, an annealing process is applied to the semiconductor substrate 200 to expand the first preliminary impurity region 250a and the second preliminary impurity region 260a underneath the first word line $WL_0$ and the second word line $WL_{n-1}$, respectively. As a result, a first impurity region 250 and a second impurity region 260 are formed, which may reduce vulnerability to program disturbance.

Figure 9A:
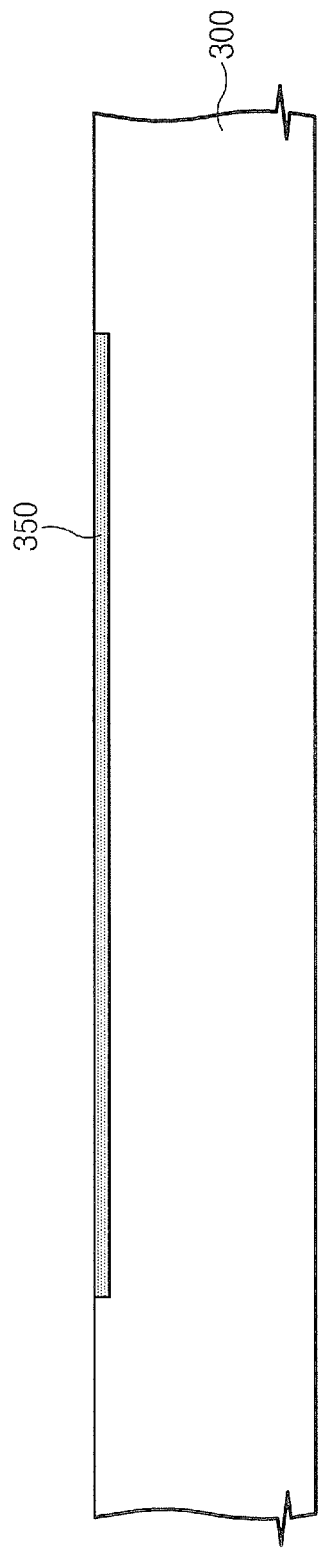
FIGS. 9A to 9B are cross-sectional views illustrating operations for forming a non-volatile memory device in accordance with still further embodiments of the present invention.
Figure 9B:
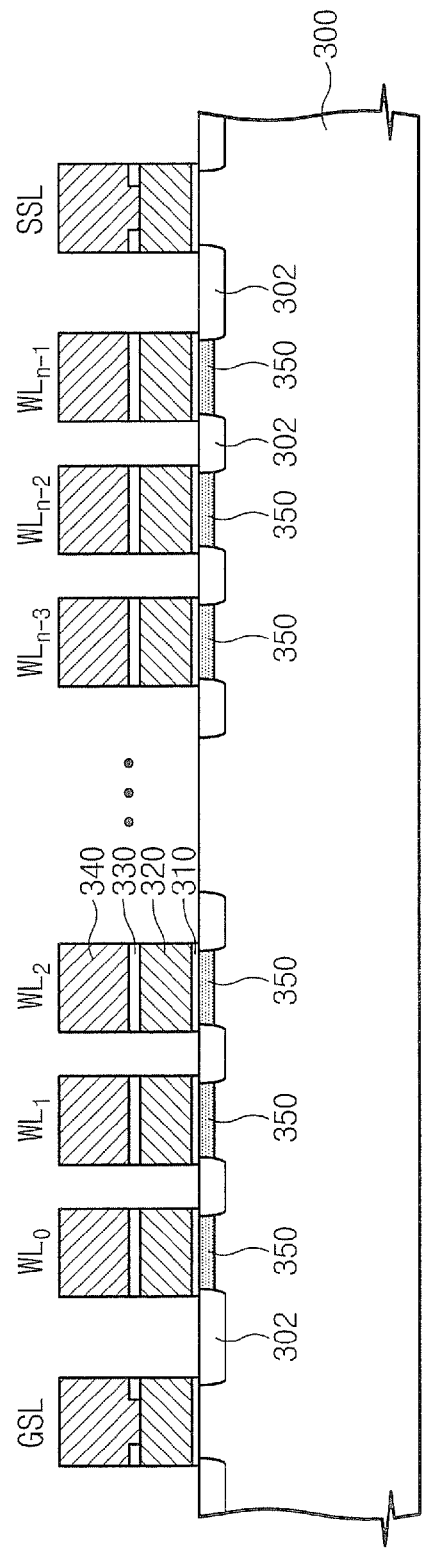

Referring to FIG. 9A, a p-type semiconductor substrate 300 is provided. An ion implantation process is preformed to form a first conductivity type (e.g., n-type) region 350 in upper portion of the semiconductor substrate 300. In particular, the impurity region 350 may be located where a plurality of word lines is to be formed. Referring to FIG. 9B, a plurality of word lines $WL_0$-$WL_{n-1}$ is formed on the semiconductor substrate 300. A ground select line GSL and a string select line SSL are formed on the substrate 300 on respective sides of the word lines $WL_0$-$WL_{n-1}$. An ion implantation process is applied to the semiconductor substrate 300, which is exposed between the word lines $WL_0$-$WL_{n-1}$, the ground select line GSL and the string select line SSL, to form source/drain regions 302. Impurity regions 350 may thereby be formed underneath the word lines $WL_0$-$WL_{n-1}$, between the source/drain regions 302.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. The invention is defined by the following claims.

What is claimed is:

1. A method of forming a nonvolatile memory device comprising:

forming a plurality of word lines on a semiconductor substrate of a first conductivity type, each of the plurality of word lines comprising a floating gate of a second conductivity type;

forming a ground select line and a string select on the substrate on respective sides of the word lines; and forming an impurity region of the second conductivity type underlying a first word line adjacent the ground select line by doping the substrate with a dopant of the second conductivity type, wherein a channel region of the first word line is separated from an upper surface of the semiconductor substrate by the impurity region.

2. The method of claim 1, wherein the first conductivity type is p-type and wherein the second conductivity type is n-type.

3. A method of forming a nonvolatile memory device comprising:

forming a plurality of word lines on a semiconductor substrate of a first conductivity type, each of the plurality of word lines comprising a floating gate of a second conductivity type;

forming a ground select line and a string select on the substrate on respective sides of the word lines; and forming an impurity region of the second conductivity type underlying a first word line adjacent the ground select line by doping the substrate with a dopant of the second conductivity type, wherein the forming an impurity region comprises:

performing an oblique ion implantation using the word lines as masks to form a preliminary impurity region adjacent the first word line; and annealing the semiconductor substrate to form the impurity region from the preliminary impurity region.

4. The method of claim 3, wherein a distance between the word lines is less than a distance between the first word line and the ground select line, and wherein the oblique ion implantation process is performed at an angle such that impurity ions are implanted into the semiconductor substrate between the first word line and the ground select line and not into the semiconductor substrate between the word lines.

5. The method of claim 3, wherein performing an oblique ion implantation is preceded by forming a photoresist pattern covering the string select line and a second word line adjacent the string select line and wherein performing an oblique ion implantation comprises performing the oblique ion implantation using the photoresist pattern as an ion implantation mask.

6. A method of forming nonvolatile memory device comprising:

forming a plurality of word lines on a semiconductor substrate of a first conductivity type, each of the plurality of word lines comprising a floating gate of a second conductivity type;

forming a ground select line and a string select on the substrate on respective sides of the word lines;

forming a first impurity region of the second conductivity type underlying a first word line adjacent the ground select line by doping the substrate with a dopant of the second conductivity type; and forming a second impurity region of the second conductivity type underlying a second word line adjacent the string select line, wherein forming second impurity region comprises:

performing an oblique ion implantation process using the word lines as masks to form a preliminary impurity region adjacent the second word line; and annealing the semiconductor substrate to form the second impurity region from the preliminary impurity region.

7. The method of claim 6, wherein a distance between the word lines is less than a distance between the second word line and the string select line and wherein the oblique ion implantation process is performed at an angle such that impurity ions are implanted into the semiconductor substrate between the second word line and the string select line and not implanted into the semiconductor substrate between the word lines.

8. The method of claim 6, wherein performing an oblique ion implantation process is preceded by forming a photoresist pattern covering the ground select line and the first word line and wherein performing an oblique ion implantation comprises performing the oblique ion implantation using the photoresist pattern as an ion implantation mask.

9. A method of forming a nonvolatile memory device comprising:

forming impurity regions of a second conductivity type in a semiconductor substrate of a first conductivity type by doping the substrate with a dopant of the second conductivity type;

forming word lines, each including a floating gate of the second conductivity type, on respective ones of the impurity regions;

forming aground select line and a string select line on the substrate on respective sides of the word lines; and forming source/drain regions in the semiconductor substrate between the word lines, wherein respective channel regions of the respective word lines are separated from an upper surface of the semiconductor substrate by respective ones of the impurity regions.

10. The method of claim 9, wherein the first conductivity type is p-type and wherein the second conductivity type is n-type.

11. A method of forming a nonvolatile memory device comprising:

forming impurity regions of a second conductivity type in a semiconductor substrate of a first conductivity type by doping the substrate with a dopant of the second conductivity type;

forming word lines, each including a floating gate of the second conductivity type, on respective ones of the impurity regions;

forming a ground select line and a string select line on the substrate on respective sides of the word lines; and forming source/drain regions in the semiconductor substrate between the word lines;

forming an impurity region of the second conductivity type in the substrate; and implanting ions into the substrate using the word lines as an ion implantation mask to form the impurity regions and the source/drain regions.

* * * * *